(12) United States Patent
Tomioka et al.

(10) Patent No.: US 10,261,373 B2
(45) Date of Patent: Apr. 16, 2019

(54) DISPLAY DEVICE AND METHOD OF MANUFACTURING THE SAME

(71) Applicant: Japan Display Inc., Minato-ku (JP)

(72) Inventors: Tetsuya Tomioka, Tokyo (JP); Yoshitada Kometani, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/478,588

(22) Filed: Apr. 4, 2017

(65) Prior Publication Data

US 2017/0293191 A1 Oct. 12, 2017

(30) Foreign Application Priority Data

Apr. 12, 2016 (JP) ................. 2016-079782

(51) Int. Cl.
| | |
|---|---|
| *H01L 29/78* | (2006.01) |
| *H01L 27/12* | (2006.01) |
| *G02F 1/1362* | (2006.01) |
| *G02F 1/1343* | (2006.01) |
| *G02F 1/1368* | (2006.01) |
| *H01L 29/786* | (2006.01) |

(52) U.S. Cl.
CPC ...... *G02F 1/136227* (2013.01); *G02F 1/1368* (2013.01); *G02F 1/134309* (2013.01); *H01L 27/124* (2013.01); *H01L 27/1222* (2013.01); *H01L 27/1262* (2013.01); *H01L 29/78633* (2013.01); *H01L 29/78645* (2013.01); *H01L 29/78675* (2013.01); *G02F 2001/134372* (2013.01); *G02F 2201/121* (2013.01); *G02F 2201/123* (2013.01)

(58) Field of Classification Search
CPC ... H01L 27/1222; H01L 27/12; H01L 27/124; H01L 29/78; H01L 29/78645
USPC ....................................... 257/59, 72
See application file for complete search history.

(56) References Cited

U.S. PATENT DOCUMENTS

| | | | |
|---|---|---|---|
| 9,818,881 B2* | 11/2017 | Sasaki | H01L 29/7869 |
| 2002/0190253 A1* | 12/2002 | Tsujimura | H01L 27/12 257/59 |
| 2003/0189207 A1* | 10/2003 | Murakami | G02F 1/136227 257/59 |
| 2003/0193054 A1* | 10/2003 | Hayakawa | H01L 27/12 257/72 |

(Continued)

FOREIGN PATENT DOCUMENTS

| | | |
|---|---|---|
| JP | 2007-328210 | 12/2007 |
| JP | 2014-149340 A | 8/2014 |
| JP | 2015-76487 A | 4/2015 |

*Primary Examiner* — Fazli Erdem
(74) *Attorney, Agent, or Firm* — Oblon, McClelland, Maier & Neustadt, L.L.P.

(57) ABSTRACT

According to one embodiment, a display device includes a semiconductor layer, a metal portion, and a pixel electrode, the metal portion being in contact with the semiconductor layer through a first contact hole, the pixel electrode being in contact with the metal portion through a second contact hole, the metal portion being a stacked layer body including at least a first conductive layer and a second conductive layer, an edge of the first contact hole being located inside the second contact hole without crossing an edge of the second contact hole, in planar view, the pixel electrode being in contact with the first conductive layer.

13 Claims, 11 Drawing Sheets

(56) References Cited

U.S. PATENT DOCUMENTS

| | | | |
|---|---|---|---|
| 2003/0197178 A1* | 10/2003 | Yamazaki | G02F 1/136227 257/59 |
| 2005/0170565 A1* | 8/2005 | Fujii | H01L 27/12 438/149 |
| 2007/0042597 A1* | 2/2007 | Yamazaki | H01L 21/288 438/622 |
| 2007/0058099 A1* | 3/2007 | Eguchi | G02F 1/136227 349/43 |
| 2007/0269988 A1* | 11/2007 | Chi | H01L 21/76804 438/706 |
| 2007/0298538 A1 | 12/2007 | Tanabe et al. | |
| 2008/0179597 A1* | 7/2008 | Yamazaki | H01L 27/12 257/59 |
| 2010/0227425 A1 | 9/2010 | Tanabe et al. | |
| 2011/0227083 A1 | 9/2011 | Tanabe et al. | |
| 2011/0312127 A1* | 12/2011 | Ishizuka | H01L 21/31111 438/104 |
| 2012/0299028 A1 | 11/2012 | Tanabe et al. | |
| 2013/0308072 A1 | 11/2013 | Tanabe et al. | |
| 2014/0042444 A1* | 2/2014 | Huang | H01L 29/78654 257/59 |
| 2014/0132902 A1 | 5/2014 | Tanabe et al. | |
| 2015/0212364 A1 | 7/2015 | Tanabe et al. | |
| 2016/0147110 A1 | 5/2016 | Tanabe et al. | |
| 2017/0236842 A1* | 8/2017 | Matsuda | H01L 27/1222 257/43 |

* cited by examiner

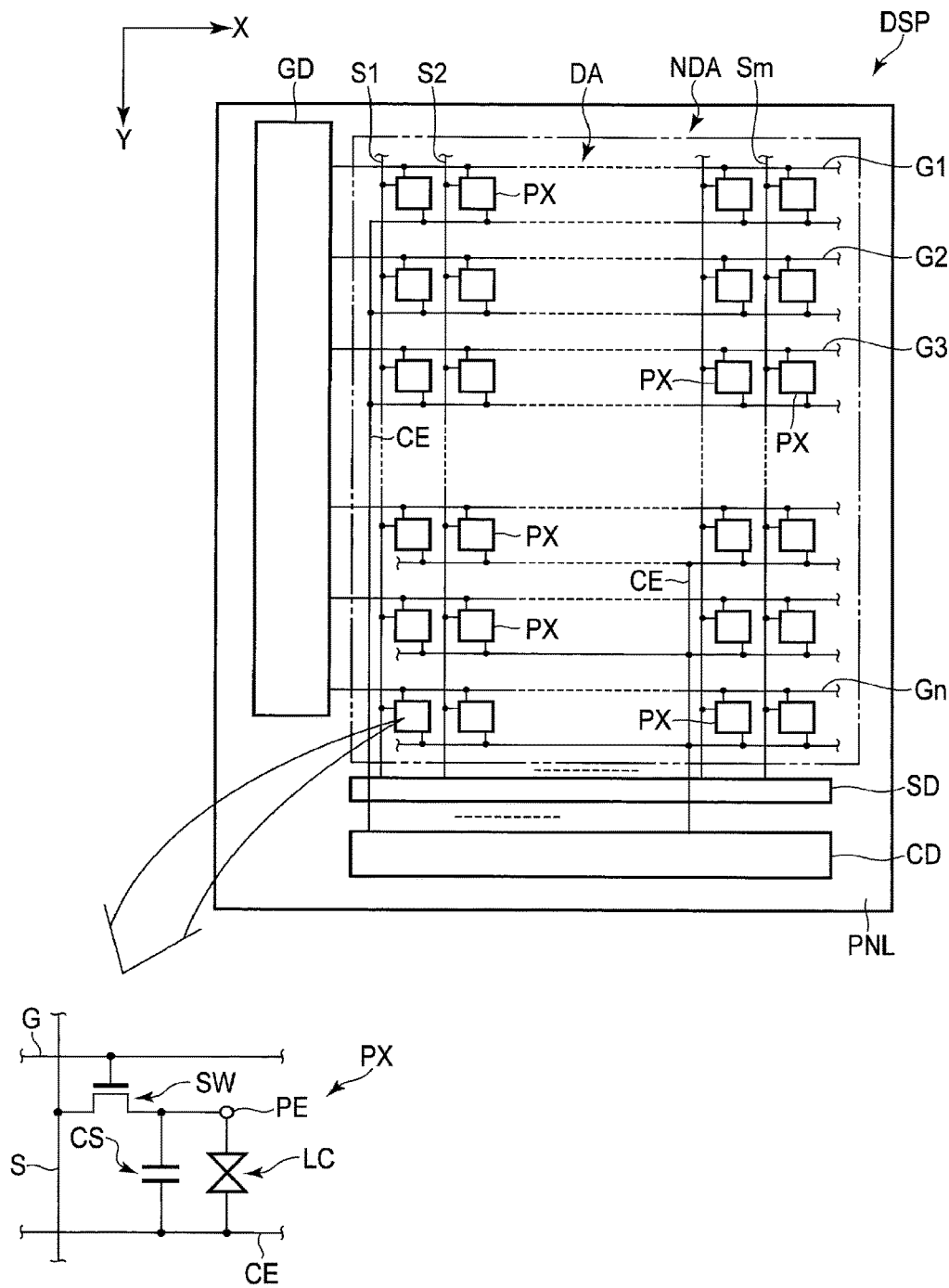
F I G. 1

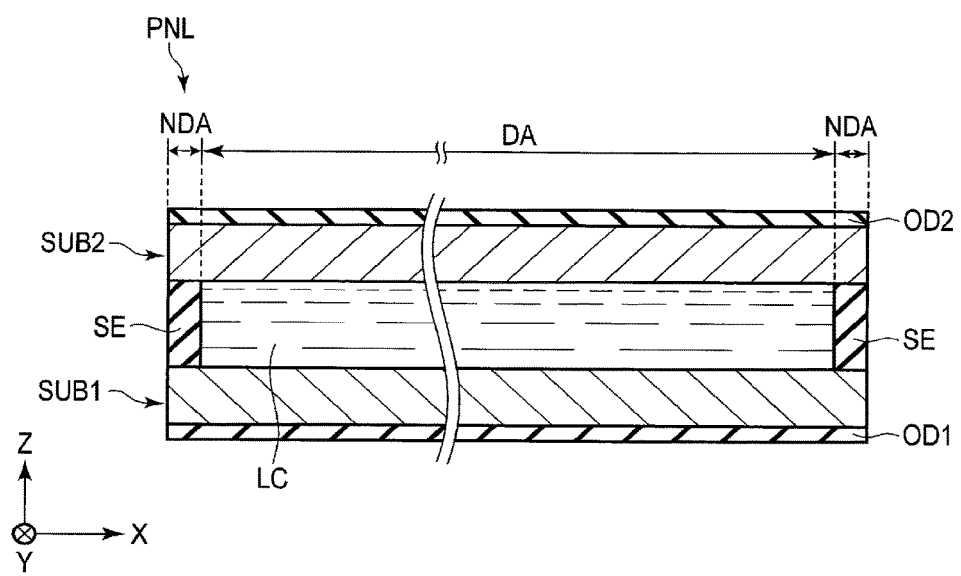
F I G. 2

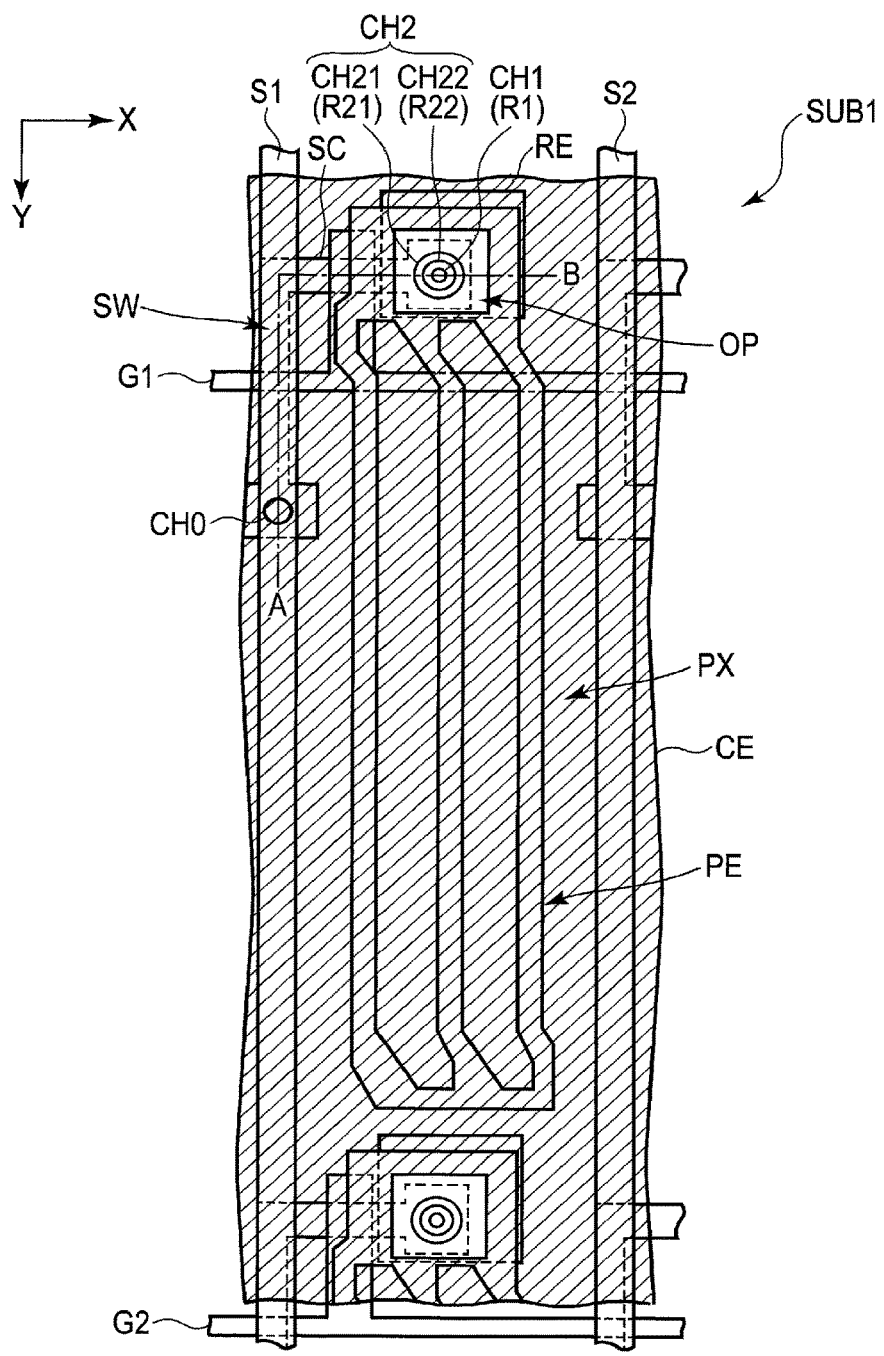
F I G. 3

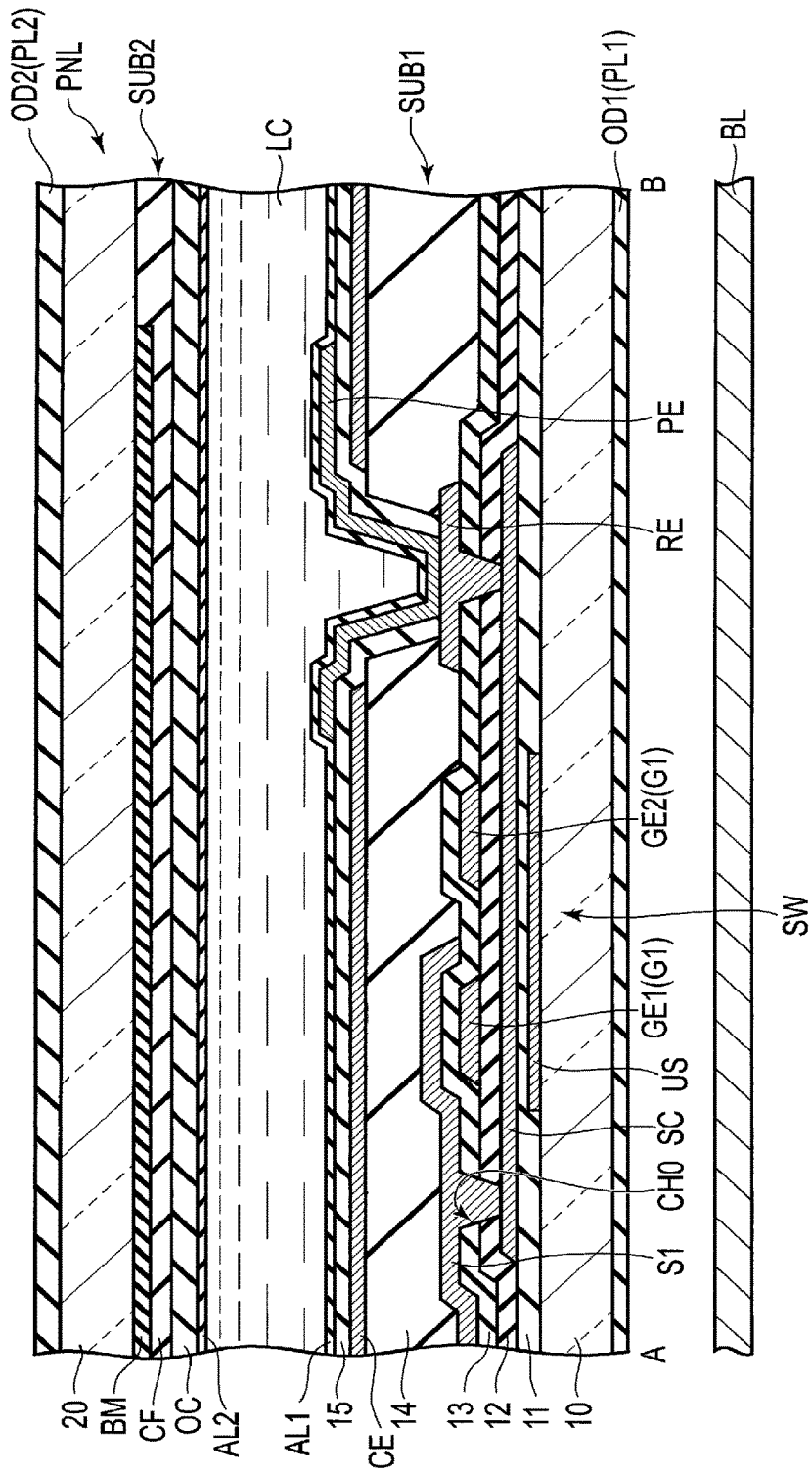
F I G. 4

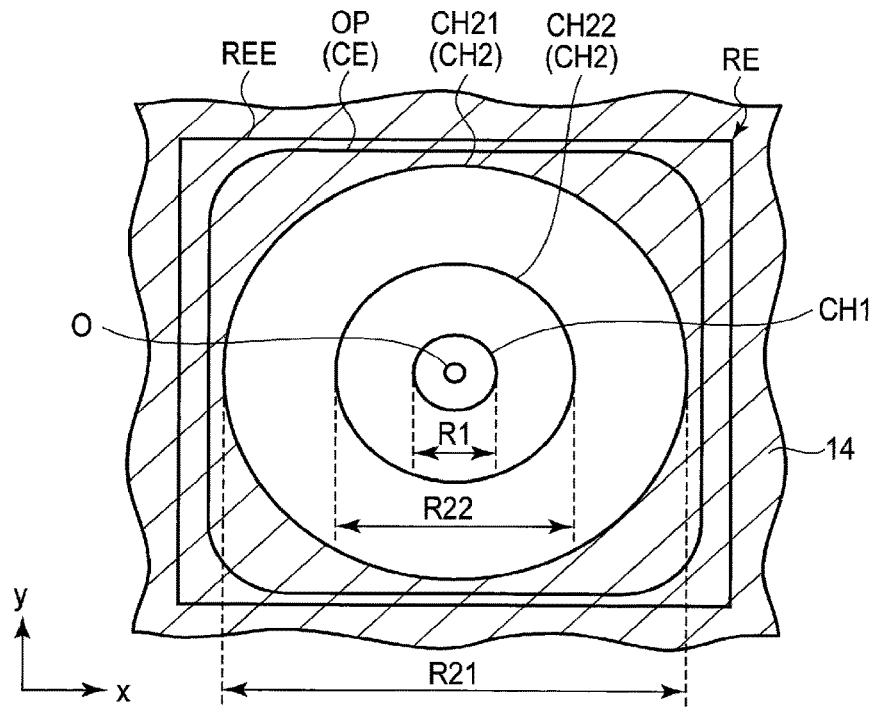
F I G. 6
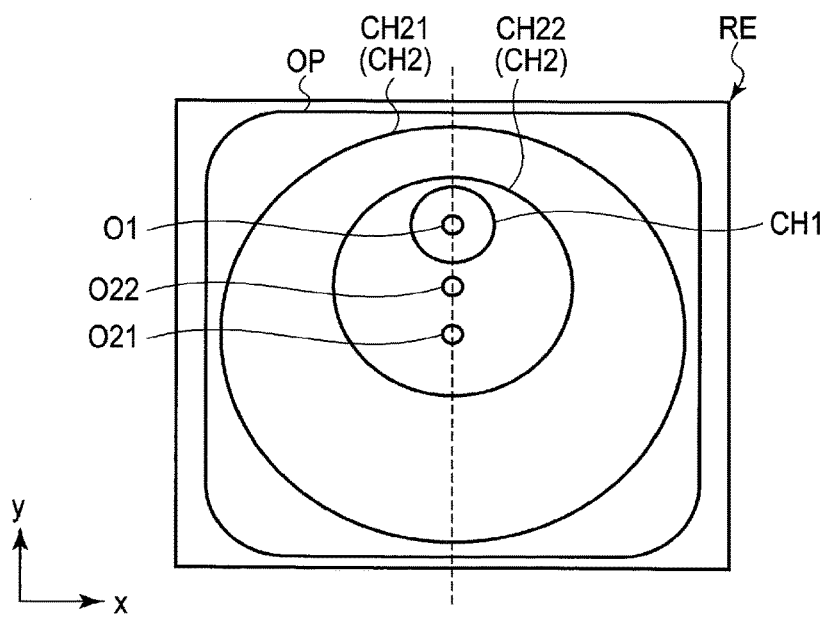
F I G. 7

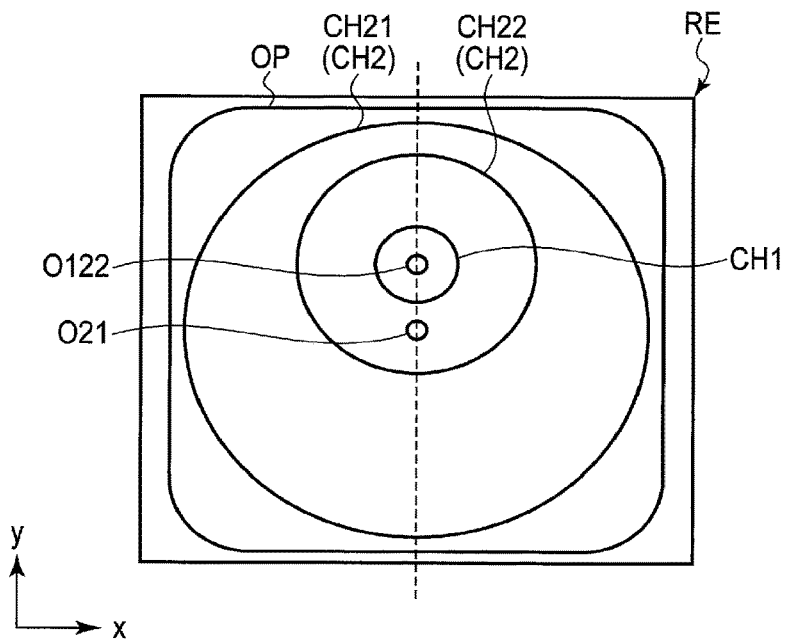
F I G. 8
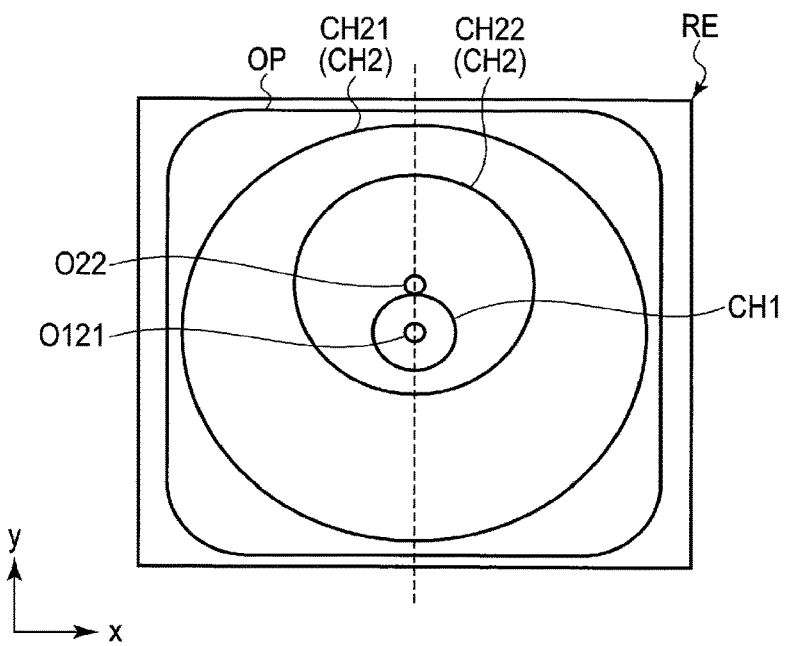
F I G. 9

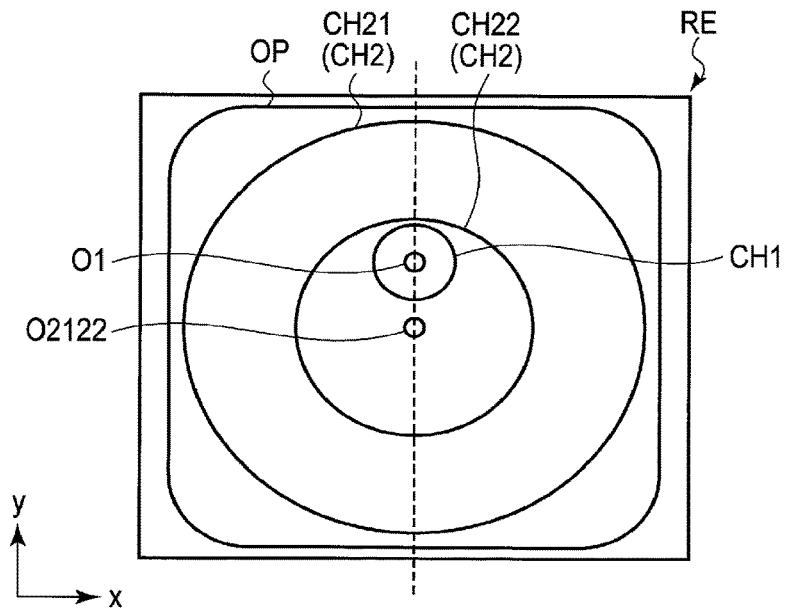
F I G. 10
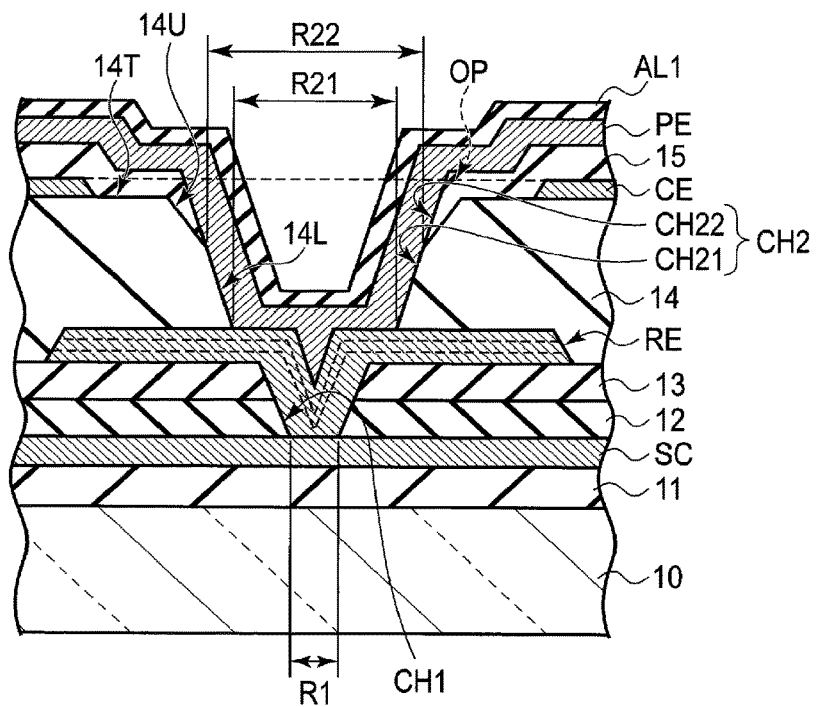
F I G. 11

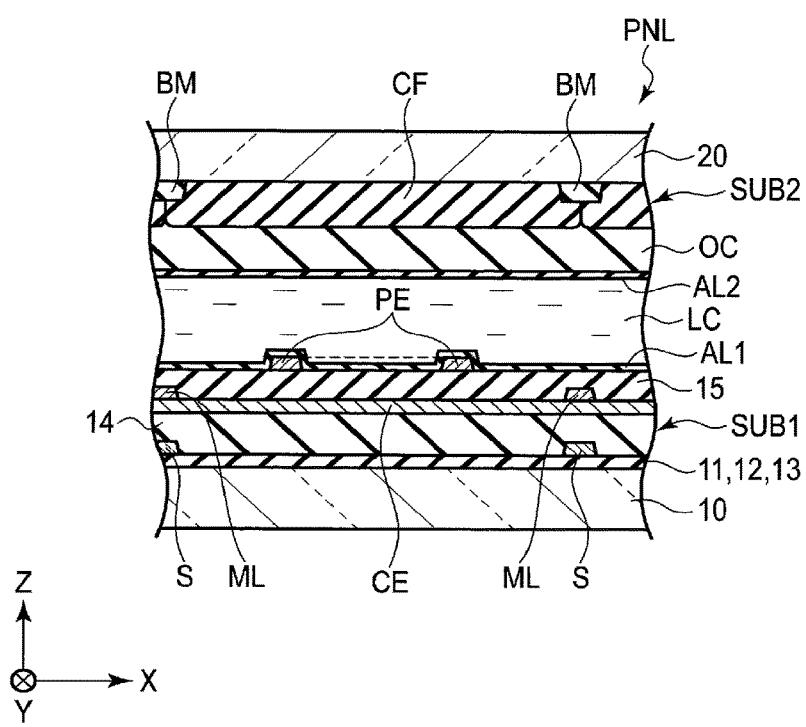
F I G. 13

DISPLAY DEVICE AND METHOD OF MANUFACTURING THE SAME

CROSS-REFERENCE TO RELATED APPLICATIONS

This application is based upon and claims the benefit of priority from Japanese Patent Application No. 2016-079782, filed Apr. 12, 2016, the entire contents of which are incorporated herein by reference.

FIELD

Embodiments described herein relate generally to a display device and a method of manufacturing the same.

BACKGROUND

The display device comprises various signal lines, a switching element, a pixel electrode, etc. In the switching element, a semiconductor layer and a source/drain electrode are connected through a first contact hole, and another source/drain electrode and a pixel electrode are connected through a second contact hole. In a structure in which an organic insulating film is interposed between the source/drain electrode and the pixel electrode, there is a tendency that the depth of the second contact hole is increased, and the diameter is also increased. An area which overlaps the contact hole and a peripheral area of the contact hole become a part which has a large difference in level, and which does not contribute to display.

Requirement for higher definition has recently been increased in the display devices of nowadays, and while a size of one pixel is reduced, the number of lines used for wiring tends to be increased. Accordingly, there has been a demand for suppressing deterioration in display quality caused by, for example, a reduction of an opening which contributes to display.

BRIEF DESCRIPTION OF THE DRAWINGS

FIG. 1 is an illustration showing a basic structure and an equivalent circuit of a display device DSP according to the present embodiment.

FIG. 2 is a cross-sectional view showing the structure of a display panel PNL.

FIG. 3 is a plan view showing the structure of a pixel of the display panel PNL shown in FIG. 2.

FIG. 4 is a cross-sectional view showing the structure of a part of the display panel shown in FIGS. 2 and 3.

FIG. 6 is a plan view showing an arrangement example of a first contact hole CH1 and a second contact hole CH2 shown in FIG. 5.

FIG. 7 is a plan view showing another arrangement example of the first contact hole CH1 and the second contact hole CH2 shown in FIG. 5.

FIG. 8 is a plan view showing yet another arrangement example of the first contact hole CH1 and the second contact hole CH2 shown in FIG. 5.

FIG. 9 is a plan view showing yet another arrangement example of the first contact hole CH1 and the second contact hole CH2 shown in FIG. 5.

FIG. 10 is a plan view showing yet another arrangement example of the first contact hole CH1 and the second contact hole CH2 shown in FIG. 5.

FIG. 11 is a cross-sectional view for explaining another structure of connection between the switching element SW and the pixel electrode PE shown in FIG. 4.

FIG. 13 is a cross-sectional view of a display panel PNL including a first substrate SUB1 shown in FIG. 12 taken along a first direction X.

DETAILED DESCRIPTION

Figure 5:
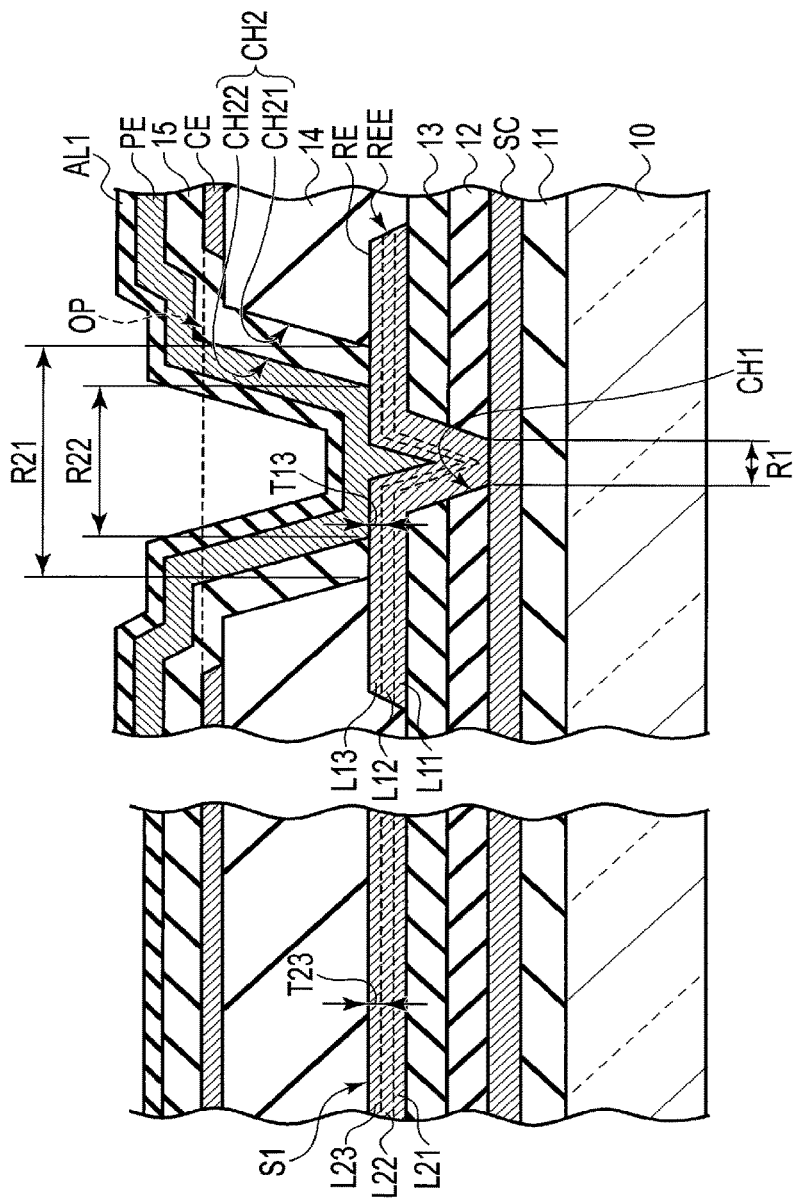
FIG. 5 is a cross-sectional view for explaining the structure of connection between a switching element SW and a pixel electrode PE shown in FIG. 4.

In general, according to one embodiment, a display device includes a semiconductor layer, a metal portion, a common electrode, a pixel electrode, a first interlayer insulating film located between the semiconductor layer and the metal portion, a second interlayer insulating film located between the metal portion and the common electrode, and a third interlayer insulating film located between the common electrode and the pixel electrode, the metal portion being in contact with the semiconductor layer through a first contact hole formed in the first interlayer insulating film, the pixel electrode being in contact with the metal portion through a second contact hole formed in the second and third interlayer insulating films, the metal portion being a stacked layer body including at least a first conductive layer and a second conductive layer, an edge of the first contact hole being located inside the second contact hole without crossing an edge of the second contact hole, in planar view, the pixel electrode being in contact with the first conductive layer.

According to another embodiment, a method of manufacturing a display device includes: forming a first contact hole in a first interlayer insulating film located above a semiconductor layer, the first contact hole being penetrated to the semiconductor layer; forming a metal portion which is a stacked layer body including at least a first conductive layer and a second conductive layer on the first interlayer insulating film, and the metal portion being in contact with the semiconductor layer through the first contact hole; forming a first hole of a second contact hole in a second interlayer insulating film located above the metal portion, the first hole being penetrated to the metal portion; forming a second hole of the second contact hole in a third interlayer insulating film located above the second interlayer insulating film, the second hole being penetrated to the metal portion; and forming a pixel electrode on the third interlayer insulating film, and the pixel electrode being in contact with the first conductive layer of the metal portion through the second contact hole, an edge of the first contact hole being located inside the second contact hole without crossing an edge of the second contact hole, in planar view, the second hole being formed by dry etching which uses plasma gas not containing oxygen.

According to yet another embodiment, a display device includes a semiconductor layer, a metal portion, a common electrode, a pixel electrode, a first interlayer insulating film located between the semiconductor layer and the metal portion, a second interlayer insulating film located between the metal portion and the common electrode, and a third interlayer insulating film located between the common electrode and the pixel electrode, the metal portion being in contact with the semiconductor layer through a first contact hole formed in the first interlayer insulating film, the pixel electrode being in contact with the metal portion through a first hole formed in the second interlayer insulating film and a second hole formed in the third interlayer insulating film, an edge of the first contact hole being located inside the second hole without crossing an edge of the second hole, the edge of the second hole being located inside the first hole without crossing an edge of the first hole, in planar view, a center of the first contact hole, a center of the first hole, and a center of the second hole being located on a same straight line.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, and redundant detailed description thereof is omitted unless necessary.

FIG. 1 is an illustration showing a basic structure and an equivalent circuit of a display device DSP according to the present embodiment. In the drawing, a first direction X and a second direction Y are orthogonal to each other; however, they may cross each other at any angle other than 90°. In the present embodiment, a liquid crystal display device is explained as an example of the display device. Note that the main structures disclosed in the present embodiment are applicable to display devices such as a self-luminous display device with organic electroluminescent display elements and the like, an electronic paper display device with cataphoretic elements and the like, a display device employing micro-electromechanical systems (MEMS), and a display device employing electrochromism.

The display device DSP includes a display panel PNL, etc. The display panel PNL is, for example, a liquid crystal display panel. The display panel PNL includes a display area DA in which an image is displayed, and a frame-like non-display area NDA which surrounds the display area DA. The display panel PNL includes a plurality of pixels PX in the display area DA. The pixels PX are arrayed in a matrix. Also, the display panel PNL includes scanning lines G (G1 to Gn), signal lines S (S1 to Sm), a common electrode CE, and the like, in the display area DA. The scanning lines G extend in the first direction X, are arranged in the second direction Y, and are connected to a scanning line drive circuit GD. The signal lines S extend in the second direction Y, are arranged in the first direction X, and are connected to a signal line drive circuit SD. Note that the scanning lines G and the signal lines S do not necessarily extend linearly, and may be partially bent. The common electrode CE is arranged over the pixels PX, and is connected to a common electrode drive circuit CD.

Each of the pixels PX comprises a switching element SW, a pixel electrode PE, the common electrode CE, a liquid crystal layer LC, and the like. The switching element SW is constituted by a thin-film transistor (TFT), for example, and is electrically connected to the scanning line G and the signal line S. The scanning line G is connected to the switching elements SW of the respective pixels PX arranged in the first direction X. The signal line S is connected to the switching elements SW of the respective pixels PX arranged in the second direction Y. The pixel electrode PE is electrically connected to the switching element SW. Each pixel electrode PE is opposed to the common electrode CE, and drives the liquid crystal layer LC by an electric field produced between the pixel electrode PE and the common electrode CE. A storage capacitance CS is formed between, for example, an electrode having the same potential as that of the common electrode CE and an electrode having the same potential as that of the pixel electrode PE.

FIG. 2 is a cross-sectional view showing the structure of the display panel PNL. A third direction Z in FIG. 3 is the direction which intersects the first direction X and the second direction Y. It is assumed that an observation position at which the display panel PNL is to be observed is at the pointing end side of an arrow indicating the third direction Z, and a view toward an X-Y plane from the observation position is called a planar view.

The display panel PNL comprises a first substrate SUB1, a second substrate SUB2, the liquid crystal layer LC, a sealant SE, optical element OD1, optical element OD2, etc. The second substrate SUB2 is opposed to the first substrate SUB1. The sealant SE is located in the non-display area NDA, and bonds the first substrate SUB1 and the second substrate SUB2 to each other. The liquid crystal layer LC is held between the first substrate SUB1 and the second substrate SUB2. Optical element OD1 is arranged on a side opposite to a side of the first substrate SUB1 that is in contact with the liquid crystal layer LC. Optical element OD2 is arranged on a side opposite to a side of the second substrate SUB2 that is in contact with the liquid crystal layer LC.

Further, the details of the configuration of the display panel PNL are not explained here, but the display panel PNL may have a configuration corresponding to any one of a display mode using a longitudinal electric field produced along the normal line of the main surface of the substrate, a display mode using an oblique electric field which is inclined obliquely with respect to the main surface of the substrate, a display mode using a lateral electric field produced along the main surface of the substrate, and a display mode using an appropriate combination of the longitudinal electric field, the lateral electric field, and the oblique electric field. The main surface of the substrate is a surface parallel to the X-Y plane defined by the first direction X and the second direction Y.

The display panel PNL of the present embodiment may be a transmissive display panel having a transmissive display function of displaying an image by selectively passing light from a rear surface of the first substrate SUB1, a reflective display panel having a reflective display function of displaying an image by selectively reflecting light from a front surface of the second substrate SUB2, or a transflective display panel including both the transmissive display function and the reflective display function.

FIG. 3 is a plan view showing the structure of a pixel of the display panel PNL shown in FIG. 2. The illustrated example corresponds to a case where a fringe field switching (FFS) mode, which is one of display modes IPS using the lateral electric field, is applied. Note that only the main portions of the first substrate SUB1 are illustrated for explanation.

The first substrate SUB1 includes scanning lines G1 and G2, signal lines S1 and S2, the switching element SW, a relay electrode RE, the common electrode CE, the pixel electrode PE, and the like. The scanning lines G1 and G2 extend in the first direction X, and are arranged in the second direction Y. The signal lines S1 and S2 extend in the second direction Y, and are arranged in the first direction X. The switching element SW is electrically connected to the scanning line G1 and the signal line S1. Although the switching element SW of the illustrated example has a double-gate structure, it may have a single-gate structure. A semiconductor layer SC of the switching element SW is electrically connected to the signal line S1 at its one end, and is electrically connected to the relay electrode RE on the other end. The signal line S1 is in contact with the semiconductor layer SC through a contact hole CH0. The relay electrode RE is in contact with the semiconductor layer SC through a contact hole CH1. The common electrode CE is disposed over substantially the entire area of the pixel PX which is partitioned by the scanning line G1 and G2 and the signal lines S1 and S2, and overlaps the scanning line G1 and G2 and the signal lines S1 and S2. The common electrode CE includes an opening OP which overlaps the relay electrode RE. In the drawing, the common electrode CE corresponds to a hatched portion. The pixel electrode PE is connected to the relay electrode RE at a position which overlaps the opening OP, and overlaps the common electrode CE in the pixel PX. The pixel electrode PE is in contact with the relay electrode RE through a second contact hole CH2. Although the second contact hole CH2 includes a first hole CH21 and a second hole CH22, the details of these holes will be described later. The first contact hole CH1, the first hole 21, and the second hole CH22 are substantially circular, and have diameter R1, diameter R21, and diameter R22, respectively.

FIG. 4 is a cross-sectional view showing the structure of a part of the display panel PNL shown in FIGS. 2 and 3. The illustrated cross-section corresponds to a cross-section taken along line A-B of FIG. 3. In the present specification, a direction toward a pointing end of the arrow indicating the third direction Z is referred to as upward (or merely above), and a direction toward the opposite side from the pointing end of the arrow is referred to as downward (or merely below).

The first substrate SUB1 includes a first insulating substrate 10, a lower light-shielding layer US, a first insulating film 11, a second insulating film 12, a third insulating film 13, a fourth insulating film 14, a fifth insulating film 15, the scanning line G1, the signal line S1, the switching element SW, the common electrode CE, the pixel electrode PE, a first alignment film AL1, and the like. The switching element SW comprises the semiconductor layer SC and the relay electrode RE.

The first insulating substrate 10 is a light transmissive substrate such as a glass substrate or a resin substrate. The lower light-shielding layer US is located on the first insulating substrate 10 and is covered with the first insulating film 11, but this layer may be omitted. The lower light-shielding layer US blocks light directed toward the semiconductor layer SC from a backlight unit BL. The semiconductor layer SC is located on the first insulating film 11 and is covered with the second insulating film 12. The semiconductor layer SC is formed of, for example, polycrystalline silicon, but may be formed of amorphous silicon or an oxide semiconductor.

Gate electrodes GE1 and GE2, which are parts of the scanning line G1, are disposed on the second insulating film 12, and are covered by the third insulating film 13. The scanning line G1 and the gate electrodes GE1 and GE2 are formed of a metal material such as aluminum (Al), titanium (Ti), silver (Ag), molybdenum (Mo), tungsten (W), copper (Cu) or chromium (Cr), or an alloy obtained by combining the aforementioned metal materials, and may have a single-layer structure or a multilayer structure. Preferably, the lower light-shielding layer US should be located directly under the semiconductor layer SC at a position opposed to the gate electrodes GE1 and GE2.

The signal line S1 and the relay electrode RE are located on the third insulating film 13, and are covered with the fourth insulating film 14. The signal line S1 is in contact with the semiconductor layer SC through the contact hole CH0 which penetrates the second insulating film 12 and the third insulating film 13. The relay electrode RE is in contact with the semiconductor layer SC through a contact hole which penetrates the second insulating film 12 and the third insulating film 13. The structure of connection between the relay electrode RE and the semiconductor layer SC will be described in detail later. The signal line S1 and the relay electrode RE are formed of the same material, and the above-mentioned metal material can be applied. In one example, for the signal line S1 and the relay electrode RE, a stacked layer body of a three-layer structure having a layer formed of a material including aluminum between two layers each formed of a material including titanium may be applied. Alternatively, a stacked layer body of more than three layers may be applied to the signal line S1 and the relay electrode RE, and an uppermost layer and an undermost layer may be formed of different materials.

The common electrode CE is located on the fourth insulating film 14 and is covered with the fifth insulating film 15. The pixel electrode PE is located on the fifth insulating film 15 and is covered with the first alignment film AL1. A part of the pixel electrode PE is opposed to the common electrode CE via the fifth insulating film 15. The common electrode CE and the pixel electrode PE are formed of a transparent conductive material such as indium-tin-oxide (ITO) or indium-zinc-oxide (IZO). The pixel electrode PE is in contact with the relay electrode RE through a contact hole which penetrates the fourth insulating film 14 and the fifth insulating film 15 at a position which overlaps the opening of the common electrode CE.

Each of the first insulating film 11, the second insulating film 12, the third insulating film 13, and the fifth insulating film 15 is an inorganic insulating film such as silicon oxide, silicon nitride, or silicon oxynitride, and may have a single-layer structure or a multilayer structure. The fourth insulating film 14 is an organic insulating film such as acrylic resin.

The second substrate SUB2 comprises a second insulating substrate 20, a light-shielding layer BM, a color filter CF, an overcoat layer OC, a second alignment film AL2, etc.

The second insulating substrate 20 is a light transmissive substrate such as a glass substrate or a resin substrate. The light-shielding layer BM and the color filter CF are located on the second insulating substrate 20 at the side opposed to the first substrate SUB1. The light-shielding layer BM partitions the pixels. In one example, the light-shielding layer BM is arranged at positions opposed to wiring portions such as the switching element SW, the signal lines S, and the scanning lines G. The color filter CF is arranged at a position opposed to the pixel electrode PE, and a part of the color filter CF overlaps the light-shielding layer BM. The overcoat layer OC covers the color filter CF. The second alignment film AL2 covers the overcoat layer OC.

Note that the color filter CF may be arranged in the first substrate SUB1. The light-shielding layer BM may be arranged between the color filter CF and the overcoat layer OC, or between the overcoat layer OC and the second alignment film AL2. Alternatively, instead of arranging the light-shielding layer BM, two or more color filters of different colors may be stacked on one another to reduce the transmittance, so that the stacked color filters function as the light-shielding layer. Also, a pixel which exhibits white may be added, and a white color filter or an uncolored resin material may be disposed on the white pixel, or the overcoat layer OC may be disposed without arranging the color filter. Moreover, in a monochrome display device, a color filter is omitted.

The first substrate SUB1 and the second substrate SUB2 described above are arranged such that the first alignment film AL1 and the second alignment film AL2 are opposed to each other. Though not illustrated, a spacer is formed of a resin material, and is arranged between the first substrate SUB1 and the second substrate SUB2. The spacer is formed on one of the first substrate SUB1 and the second substrate SUB2, and is in contact with the other one of those substrates. A predetermined cell gap is thereby formed between the first alignment film AL1 and the second alignment film AL2. However, apart from the spacer which forms the cell gap, a sub-spacer which does not contact the other one of the substrates in the steady state in which no external stress is applied to the display panel may be included. The cell gap is, for example, 2 to 5 µm. The first substrate SUB1 and the second substrate SUB2 are adhered to each other by a sealant with a predetermined cell gap formed therebetween.

The liquid crystal layer LC is located between the first substrate SUB1 and the second substrate SUB2, and is held between the first alignment film AL1 and the second alignment film AL2. The liquid crystal layer LC includes liquid crystal molecules. The liquid crystal layer LC described above is composed of, for example, a positive liquid crystal material (i.e., a liquid crystal material with positive dielectric anisotropy), or a negative liquid crystal material (i.e., a liquid crystal material with negative dielectric anisotropy).

With respect to the display panel PNL of the above structure, on the lower part of the first substrate SUB1, a first optical element OD1 including a first polarizer PL1 is arranged. Also, a second optical element OD2 including a second polarizer PL2 is arranged on the upper part of the second substrate SUB2. In one example, the first polarizer PL1 and the second polarizer PL2 are arranged such that their absorption axes are orthogonal to each other in the X-Y plane. Note that the first optical element OD1 and the second optical element OD2 may include a retardation film such as a quarter-wave plate or a half-wave plate, a scattering layer, an anti-reflective layer, etc., if necessary.

FIG. 5 is a cross-sectional view for explaining the structure of connection between the switching element SW and the pixel electrode PE shown in FIG. 4.

The second insulating film 12 and the third insulating film 13 correspond to a first interlayer insulating film located between the semiconductor layer SC and the relay electrode (metal portion) RE. The fourth insulating film 14 corresponds to a second interlayer insulating film located between the relay electrode RE and the common electrode CE. The fifth insulating film 15 corresponds to a third interlayer insulating film located between the common electrode CE and the pixel electrode PE. The relay electrode RE is in contact with the semiconductor layer SC through the first contact hole CH1 which penetrates the second insulating film 12 and the third insulating film 13. The relay electrode RE is a stacked layer body including a plurality of conductive layers, and is a three-layered body including conductive layers L11 to L13 in the example illustrated. The conductive layer 11 is located on the third insulating film 13, and is in contact with a side surface of the first contact hole CH1 and the semiconductor layer SC at the first contact hole CH1. The conductive layer L12 is stacked on the conductive layer L11, and the conductive layer (first conductive layer) L13 is stacked on the conductive layer (second conductive layer) L12. The pixel electrode PE is in contact with the relay electrode RE through the second contact hole CH2 which penetrates the fourth insulating film 14 and the fifth insulating film 15. In the example illustrated, the pixel electrode PE is in contact with the conductive layer L13.

The signal line S1 is a stacked layer body, which is formed in the same process as that of the relay electrode RE, and is a three-layered body including conductive layers L21 to L23 in the example illustrated. The conductive layer L21 is located on the third insulating film 13, and is formed of the same material as that of the conductive layer L11. The conductive layer L22 is stacked on the conductive layer L21, and is formed of the same material as that of the conductive layer L12. The conductive layer L23 is stacked on the conductive layer L22, and is formed of the same material as that of the conductive layer L13. The conductive layers L21 to L23 are substantially equal to the conductive layers L11 to L13 in the thickness, respectively. In particular, a thickness T13 of the conductive layer L13 at a position in contact with the pixel electrode PE is substantially equal to a thickness T23 of the conductive layer L23.

The second contact hole CH2 will now be more specifically described. The second contact hole CH2 includes the first hole CH21 formed in the fourth insulating film 14, and the second hole CH22 formed in the fifth insulating film 15. The fourth insulating film 14 directly covers an edge REE at the periphery of the relay electrode RE. The fifth insulating film 15 covers the fourth insulating film 14, covers a side surface of the first hole CH21, and is in contact with the conductive layer L13 of the relay electrode RE. A central portion of the relay electrode RE is exposed from the second hole CH22 in the second contact hole CH2. In the example illustrated, the diameter R22 of the second hole CH22 is smaller than the diameter R21 of the first hole CH21. Further, the second hole CH22 is located inside the first hole CH21. Note that the diameter R22 is greater than the diameter R1 of the first contact hole CH1. Also, the first contact hole CH1 is located inside the second contact hole CH2 or the second hole CH22. Further, the first contact hole CH1 and the second contact hole CH2 are located inside the opening OP formed in the common electrode CE. In the present specification, the diameter in the illustrated cross-section can be defined as a length of a bottom portion of the hole or the contact hole, a length of a lower layer exposed from the hole or the contact hole, or a length from one intersection of a sidewall of the hole or the contact hole and the lower layer to the other intersection of the same.

A method of producing the above structure of connection will be described briefly. Specifically, after sequentially forming the second insulating film 12 and the third insulating film 13 on the semiconductor layer SC, the first contact hole CH1 which is penetrated to the semiconductor layer SC is formed in the second insulating film 12 and the third insulating film 13.

After that, after forming a stacked layer body in which a plurality of conductive layers are stacked on the third insulating film 13 and in the first contact hole CH1, the stacked layer body is patterned. Thereby, simultaneously with forming the signal line S, the relay electrode RE which is in contact with the semiconductor layer SC through the first contact hole CH1 is formed.

After that, in addition to forming the fourth insulating film 14 on the third insulating film 13, the signal line S, and the relay electrode RE, the first hole CH21 penetrated to the relay electrode RE is formed through a photolithography process.

After that, by depositing a transparent conductive material on the fourth insulating film 14 to form a transparent conductive layer and patterning this transparent conductive layer, the common electrode CE having the opening OP is formed.

Then, after forming the fifth insulating film 15 on the fourth insulating film 14 and the common electrode CE, the second hole CH22 penetrated to the relay electrode RE is formed in the fifth insulating film 15. The second hole CH22 as described above is formed by dry etching which uses a plasma gas of a single component not containing oxygen. As the plasma gas, one of sulfur hexafluoride ($SF_6$), nitrogen trifluoride ($NF_3$), and fluorine ($F_2$) can be applied. In performing the dry etching, a photoresist is formed on the fifth insulating film 15. In the photoresist, an opening is formed at a position corresponding to where the second hole CH22 is to be formed. As the fifth insulating film 15 exposed from the opening of the photoresist is exposed to the plasma gas, the fifth insulating film 15 reacts with the plasma gas, and the fifth insulating film 15 is partially removed. An advantage obtained by applying dry etching which uses such a plasma gas of a single component will be described later.

After that, by depositing a transparent conductive material on the fifth insulating film 15 and in the second contact hole CH2 to form a transparent conductive layer and patterning this transparent conductive layer, the pixel electrode PE which is in contact with the relay electrode RE through the second contact hole CH2 is formed.

FIGS. 6 to 10 each shows a plan view showing an arrangement example of the first contact hole CH1 and the second contact hole CH2 shown in FIG. 5. For descriptive purposes, an explanation will be given by defining the x-axis and the y-axis which are orthogonal to each other. The x-axis and the y-axis are defined in a plane parallel to the above-mentioned X-Y plane, and those axes may conform to the first direction X and the second direction Y, respectively, or be different from the first direction X and the second direction Y. The shape of each part and the positional relationship between the parts will be described with an x-y plane defined by the x-axis and the y-axis in a planar view. Also, a virtual line indicating the outermost periphery of the diameter R of each contact hole in FIGS. 3 and 6 to 10 can be expressed as an edge of the contact hole.

As shown in FIG. 6, the relay electrode RE is formed in a rectangular shape having a pair of edges REE along the x-axis and a pair of edges REE along the y-axis. The opening OP of the common electrode CE is located inside the relay electrode RE without crossing the edges REE of the relay electrode RE. In other words, the entirety of the opening OP overlaps the relay electrode RE.

An edge of the first contact hole CH1 is located inside the second contact hole CH2 without crossing an edge of the second contact hole CH2. In the example illustrated, each of the first contact hole CH1, the first hole CH21, and the second hole CH22 is circular. Further, the diameter R1 of the first contact hole CH1 is smaller than the diameter R22 of the second hole CH22, and the diameter R22 of the second hole CH22 is smaller than the diameter R21 of the first hole CH21. Note that the shape of each of the first contact hole CH1, the first hole CH21, and the second hole CH22 is not limited to circular, and may be elliptical or rectangular. In the present specification, the diameter in the plane in the drawing can be defined as corresponding to a diameter of a hole or a contact hole when it is circular, a length of the hole or the contact hole in a major axis direction when it is elliptical, and a length of the hole or the contact hole along the x-axis when its shape is other than the above such as rectangular.

In one example, the diameter R1 of the first contact hole CH1 is 2.5±0.8 μm, the diameter R21 of the first hole CH21 is 5.0±0.8 μm, and the diameter R22 of the second hole CH22 is 3.8±0.9 μm. A distance between the adjacent signal lines S1 and S2 shown in FIG. 3 is approximately 14 to 20 μm, and the diameter R21 of the first hole CH21, for example, may be formed in a size of approximately 20 to 40 percent the distance between the adjacent signal lines S1 and S2.

The edge of the first contact hole CH1 is located inside the second hole CH22 without crossing an edge of the second hole CH22. The edge of the second hole CH22 is located inside the first hole CH21 without crossing an edge of the first hole CH21. In the illustrated example, centers O of the first contact hole CH1, the first hole CH21, and the second hole CH22 match one another. In other words, the x-coordinate and the y-coordinate of the center of the hole are constant for all of the first contact hole CH1, the first hole CH21, and the second hole CH22. The center intended in the present specification will be defined as corresponding to the center of a hole or a contact hole when it is circular, a point of intersection of the major axis and the minor axis of the hole or the contact hole when it is elliptical, and a point of intersection of the diagonal lines of the hole or the contact hole when its shape is other than the above such as rectangular.

The edges of the first contact hole CH1, the first hole CH21, and the second hole CH22 are located within the opening OP without crossing an edge of the opening OP. Also, the entirety of the first contact hole CH1, the first hole CH21, and the second hole CH22 overlaps the relay electrode RE while the edges of the first contact hole CH1, the first hole CH21, and the second hole CH22 do not cross the edges REE of the relay electrode RE. That is, the fourth insulating film 14 in which the first hole CH21 is formed directly covers the edges REE extending along the entire periphery of the relay electrode RE as shown by hatching in the drawing.

The example illustrated in FIG. 7 corresponds to an arrangement example in which the centers of the first contact hole CH1, the first hole CH21, and the second hole CH22 substantially match one another. In other words, center O1 of the first contact hole CH1, center O21 of the first hole CH21, and center O22 of the second hole CH22 are aligned on the same straight line. In the example illustrated, the center O1, the center O21, and the center O22 are located on the same straight line parallel to the y-axis, and the x-coordinates of the respective centers are the same. Note that the center O1, the center O21, and the center O22 may be located on the same straight line parallel to the x-axis, or may be located on the same straight line intersecting the x-axis and the y-axis.

Also in the illustrated example, the first contact hole CH1 is located within the second hole CH22, the second hole CH22 is located within the first hole CH21, the first hole CH21 is located within the opening OP, and the opening OP overlaps the relay electrode RE.

The example illustrated in FIG. 8 corresponds to another arrangement example in which the centers of the first contact hole CH1, the first hole CH21, and the second hole CH22 substantially match one another. In other words, center O122 of the first contact hole CH1 matches with center O122 of the second hole CH22, and the centers O122 and the center O21 of the first hole CH21 are aligned on the same straight line.

The example illustrated in FIG. 9 corresponds to yet another arrangement example in which the centers of the first contact hole CH1, the first hole CH21, and the second hole CH22 substantially match one another. In other words, center O121 of the first contact hole CH1 matches with center O121 of the first hole CH21, and the centers O121 and the center O22 of the second hole CH22 are aligned on the same straight line. That is, in the examples illustrated in FIGS. 8 and 9, the center of the first contact hole CH1 matches with either of the centers of the holes which constitute the second contact hole CH2, and is aligned on the same straight line with the other hole.

The example illustrated in FIG. 10 corresponds to yet another arrangement example in which the centers of the first contact hole CH1, the first hole CH21, and the second hole CH22 substantially match one another. In other words, center O2122 of the first hole CH21 matches with center O2122 of the second hole CH22, and the centers O2122 and the center O1 of the first contact hole CH1 are aligned on the same straight line. That is, in the example illustrated, the centers of the two holes which constitute the second contact hole CH2 match.

According to the present embodiment, in planar view, the edge of the first contact hole CH1 is located inside the second contact hole CH2 without crossing the edge of the second contact hole CH2. Accordingly, as compared to a case where the first contact hole CH1 and the second contact hole CH2 are displaced from each other, a connection structure for electrically connecting the switching element SW and the pixel electrode PE can be simplified, and the installation area can also be reduced. Thereby, an area of a region which does not contribute to display can be reduced. Accordingly, even if a size of one pixel is reduced in accordance with achieving higher definition, it is possible to suppress reduction of the opening, and suppress deterioration in display quality.

Also, by applying dry etching which uses a plasma gas of a single component in forming the second hole CH22, the relay electrode RE which is exposed after penetration of the fifth insulating film 15 will not be damaged by the plasma gas. Consequently, the thickness of the fifth insulating film 15 can be made substantially the same as the thickness of the signal line S covered by the fourth insulating film 14. Also, it is possible to prevent the conductive layer L12 from being exposed as a result of removing of the conductive layer L13 which constitutes the relay electrode RE, and thus, undesired oxidization of the conductive layer L12 or high resistivity of the conductive layer L12 can be suppressed. Further, there is no need to provide a thin film such as ITO for protecting the relay electrode RE from the plasma gas, and a dent created at the second contact hole CH2 can be moderated. Furthermore, an increase in the contact resistance between the switching element SW and the pixel electrode PE, which is caused by the presence of the thin film, can be suppressed. Moreover, by moderating the dent created at the second contact hole CH2, problems such as discontinuity in the film of the pixel electrode PE, or poor connection between the switching element SW and the pixel electrode PE as a result of the insulating film remaining in the second contact hole CH2 can be suppressed, and thus, it is possible to prevent the reliability from being decreased and suppress deterioration in display quality.

Also, in the above configuration example, the diameter R22 of the second hole CH22 is smaller than the diameter R21 of the first hole CH21, and in the second contact hole CH2, the fifth insulating film 15 covers the fourth insulating film 14. Accordingly, etching of the fourth insulating film 14 by the plasma gas in forming the second hole CH22 can be suppressed, and undesirable enlargement of the first hole CH21 can be suppressed.

Next, another configuration example of the present embodiment will be described. Note that the same constituent elements as those of the above-explained configuration example will be denoted by the same reference numbers, and detailed descriptions of them will be omitted.

FIG. 11 is a cross-sectional view for explaining another structure of connection between the switching element SW and the pixel electrode PE shown in FIG. 4. The configuration example illustrated in FIG. 11 is different from the configuration example illustrated in FIG. 5 in that the diameter R21 of the first hole CH21 which constitutes the second contact hole CH2 is smaller than the diameter R22 of the second hole CH22. However, as in the above configuration example, the diameter R21 is greater than the diameter R1 of the first contact hole CH1.

The fifth insulating film 15 covers the common electrode CE, and also covers an upper surface 14T of the fourth insulating film 14. Further, while the fifth insulating film 15 covers an upper side surface 14U of the fourth insulating film 14 located at the upper part of the first hole CH21, a lower side surface 14L of the fourth insulating film 14 located at the lower part of the first hole CH21 is exposed. Also, the fifth insulating film 15 does not contact the relay electrode RE. The pixel electrode PE is in contact with each of the fifth insulating film 15, the lower side surface 14L of the fourth insulating film 14, and the relay electrode RE in the second contact hole CH2.

In such a configuration example, all of the arrangement examples shown in FIGS. 6 to 10 can be applied by interchanging the first hole CH21 and the second hole CH22 in the positional relationship between the first contact hole CH1, the first hole CH21, and the second hole CH22 in planar view.

Also, the fifth insulating film 15 can be formed to cover only the common electrode CE and the upper surface 14T of the fourth insulating film 14, and not to cover the upper side surface 14U of the first hole CH21.

Also in this configuration example, the same advantages as those described above can be obtained. In addition, in this configuration example, while the fourth insulating film 14, which is an organic insulating film, is exposed from the fifth insulating film 15, by applying dry etching using plasma gas which does not contain oxygen in forming the second hole CH22, the fourth insulating film 14 which is exposed after penetration of the fifth insulating film 15 is hardly removed by the plasma gas, and the first hole CH21 can be prevented from being enlarged undesirably.

Also, since the fifth insulating film 15 exposes the lower side surface 14L of the first hole CH21 as described above, this exposed part serves to let out moisture contained in the fourth insulating film 14 during the process for manufacturing, and contributes to improvement of process yields.

Figure 12:
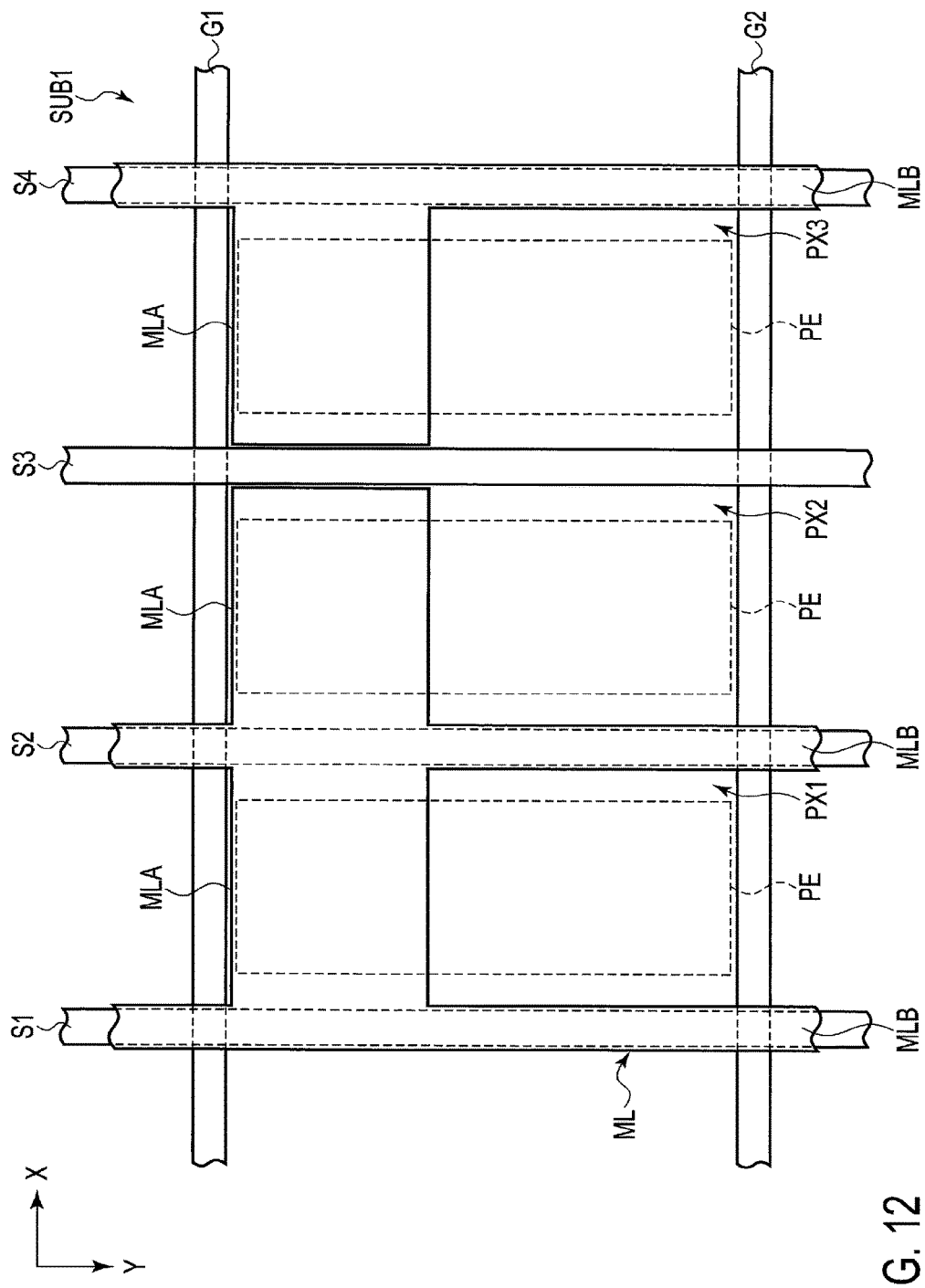
FIG. 12 is plan view showing another configuration example.

FIG. 12 is a plan view showing yet another configuration example. Note that only the main portions of the first substrate SUB1 are illustrated for explanation.

The scanning lines G1 and G2 are disposed at an interval in the second direction Y, and each of the scanning lines G1 and G2 extends in the first direction X. The signal lines S1 to S4 are disposed at an interval in the first direction X, and each of the signal lines S1 to S4 extends in the second direction Y. In the example illustrated, each of pixels PX1 to PX3 corresponds to a box-shaped area which is defined by the scanning lines G1 and G2 and the corresponding signal lines of the signal lines S1 to S4, and is rectangular in shape having a length along the first direction X shorter than a length along the second direction Y. In one example, pixel PX1 is a green pixel which exhibits green, pixel PX2 is a blue pixel which exhibits blue, and pixel PX3 is a red pixel which exhibits red. Pixels PX1 to PX3 each comprise the pixel electrode PE.

Although the common electrode CE is not illustrated in the drawing, it is disposed at a position which overlaps the scanning lines G1 and G2, the signal lines S1 to S4, and each of the pixel electrodes PE. A metal layer ML is directly stacked on the common electrode CE. The metal layer ML comprises, for example, a first portion MLA and a second portion MLB. The first portion MLA and the second portion MLB are connected to each other. The first portion MLA is arranged in each of the pixels PX1 to pixels PX3, and overlaps a part of the pixel electrode PE. The second portion MLB extends in the second direction Y, and overlaps each of the signal lines S1, S2, and S4. As illustrated in the example of the drawing, the second portion MLB may not be arranged between the pixel PX2 of a blue color and the pixel PX3 of a red color. The metal layer ML is, for example, a stacked layer body of molybdenum and aluminum, and has light reflectivity. The first portion MLA overlaps the pixel electrode PE, and forms a reflective portion in each of the pixels PX1 to PX3. Accordingly, while the display panel PNL is structured as a transmissive type which displays an image by selectively transmitting light from the backlight unit, selectively reflecting light entering from outside the display panel PNL by the reflective portion contributes to image display. Accordingly when the display device DSP is used in an environment where the surrounding is full of light, even if the brightness of the backlight unit is not increased, visibility of the display image can be improved. Further, since the second portion MLB extends along the signal line S and is set to the same potential as the common electrode CE, reducing the resistance of the common electrode CE can be promoted. Also, the second portion MLB can be used as an electrode which constitutes a capacitive touch sensor.

FIG. 13 is a cross-sectional view of the display panel PNL including the first substrate SUB1 shown in FIG. 12 taken along the first direction X.

In the first substrate SUB1, the common electrode CE is located on the fourth insulating film 14. The metal layer ML is located on the common electrode CE. In the illustrated example, the metal layer ML is directly stacked on the common electrode CE. The fifth insulating film 15 covers the common electrode CE and the metal layer ML. Note that the metal layer ML may be disposed on the fourth insulating film 14, and covered with the common electrode CE. Also, in a reflective display panel PNL, a stacked layer body formed of the common electrode CE and the metal layer ML may be replaced by the metal layer ML alone.

Figure 14:
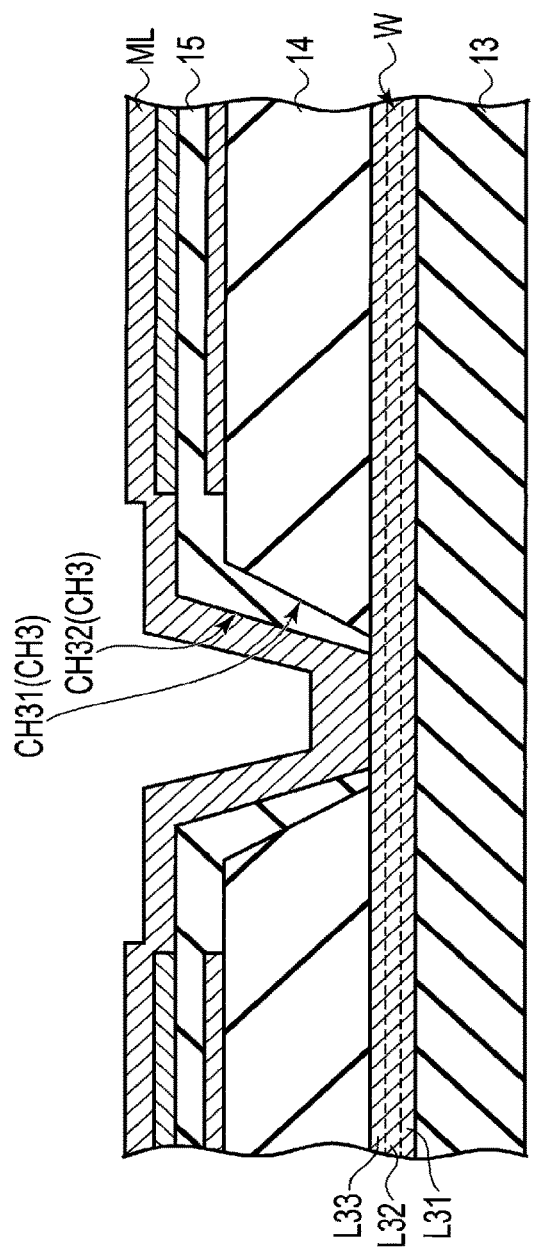
FIG. 14 is a cross-sectional view showing yet another configuration example.

FIG. 14 is a cross-sectional view showing yet another configuration example. Here, only the main portions of the first substrate SUB1 in the non-display area NDA are illustrated for explanation.

A peripheral line W corresponds to, for example, a feed line for supplying a predetermined potential, and a wiring line connected to a drive circuit, an IC chip, and the like. The illustrated peripheral line W is located in the same layer as the one in which the signal line S is disposed, is located on the third insulating film 13, and is covered by the fourth insulating film 14. The peripheral line W is a stacked layer body, which is formed in the same process as that of the signal line S, and is a three-layered body including conductive layers L31 to L33 in the example illustrated. The conductive layers L31 to L33 are formed of the same materials as those of the conductive layers L21 to L23 of the signal line S shown in FIG. 5, respectively.

The metal layer ML is in contact with the peripheral line W at a contact hole CH3. The metal layer ML corresponds to, for example, a bridge portion of a feed line for feeding a predetermined potential to the peripheral line W, a wiring line connected to a drive circuit, an IC chip, and the like, or wiring lines extending in directions crossing each other. The metal layer ML is located on the fifth insulating film 15.

The contact hole CH3 comprises a first hole CH31 formed in the fourth insulating film 14, and a second hole CH32 formed in the fifth insulating film 15. The fifth insulating film 15 covers the fourth insulating film 14, covers a side surface of the first hole CH31, and is in contact with the peripheral line W. A central portion of the peripheral line W is exposed from the second hole CH32 in the third contact hole CH3. In the example illustrated, the first hole CH31 has a diameter greater than that of the second hole CH32, and the second hole CH32 is located inside the first hole CH31.

Thicknesses of the conductive layers L31 to L33 are substantially the same as thicknesses of the conductive layers L11 to L13, respectively. In particular, the conductive layer L33 has substantially the same thickness as that of the conductive layer L23 shown in FIG. 5 at a position in contact with the metal layer ML.

A main method of producing the structure of connection as described above is similar to that explained for the above structure of connection between the switching element SW and the pixel electrode PE. That is, in the process of forming the fourth insulating film 14, the first hole CH31 penetrated to the peripheral line W is formed. Thereafter, after forming the fifth insulating film 15, the second hole CH32 penetrated to the peripheral line W is formed in the fifth insulating film 15. In forming the second hole CH32, dry etching which uses plasma gas not containing oxygen and is formed of a single component such as sulfur hexafluoride ($SF_6$) is applied. After that, the metal layer ML which is in contact with the peripheral line W through the contact hole CH3 is formed.

According to this configuration example, the same advantages as those of the above configuration example can be obtained. That is, by applying dry etching which uses a plasma gas of a single component in forming the second hole CH32, it is possible to suppress etching of the peripheral line W and the fourth insulating film 14 exposed after penetration of the fifth insulating film 15. In addition, there is no need to provide a thin film for suppressing removing of the conductive layer L33 which constitutes the peripheral line W, and a dent created at the contact hole CH3 can be moderated. Moreover, an increase in the contact resistance between the peripheral line W and the metal layer ML, which is caused by the presence of the thin film, can be suppressed.

As described above, according to the present embodiment, a display device capable of suppressing deterioration in display quality, and a method of manufacturing the same can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
an insulating substrate;
an interlayer insulating film above the insulating substrate;
an organic insulating film stacked on the interlayer insulating film;
an inorganic insulating film stacked on the organic insulating film;
an alignment film on the inorganic insulating film;
a semiconductor layer between the insulating substrate and the interlayer insulating film;
a signal line between the interlayer insulating film and the organic insulating film;
a metal relay electrode between the interlayer insulating film and the organic insulating film;
a common electrode between the organic insulating film and the inorganic insulating film; and
a pixel electrode between the inorganic insulating film and the alignment film,
wherein:
the interlayer insulating film has a first contact hole,
the organic insulating film has a first hole,
the inorganic insulating film has a second hole,
the common electrode has an opening,
the first contact hole, the first hole, the second hole and the opening overlap each other,
the metal relay electrode is in contact with the semiconductor layer through the first contact hole,
the pixel electrode is in contact with the metal relay electrode through the opening, the first hole and the second hole,
the metal relay electrode is a stacked layer body including at least a first conductive layer, a second conductive layer, and a fifth conductive layer between the first conductive layer and the second conductive layer,
an edge of the first contact hole is located inside the second hole without crossing an edge of the second hole, in planar view,
the pixel electrode is in contact with the first conductive layer in the second hole,
the semiconductor layer is in contact with the second conductive layer at a bottom surface of the first contact hole,
the edge of the second hole is located inside the first hole without crossing an edge of the first hole, in planar view, and
the edge of the first hole is located inside the opening without crossing an edge of the opening.

2. The display device of claim 1, wherein:
the signal line is a stacked layer body including at least a third conductive layer and a fourth conductive layer,
the third conductive layer is formed of a same material as that of the first conductive layer,
the fourth conductive layer is formed of a same material as that of the second conductive layer, and
a thickness of the first conductive layer is substantially equal to a thickness of the third conductive layer.

3. The display device of claim 1, wherein a center of the first contact hole substantially matches with a center of the first hole or the second hole in planar view.

4. The display device of claim 3, wherein in planar view, a center of the first hole substantially matches with a center of the second hole.

5. The display device of claim 1, wherein:
the edge of each of the first contact hole, the first hole, and the second hole overlaps the metal relay electrode without crossing an edge of the metal relay electrode, in planar view,
the organic insulating film directly covers the edge of an entire periphery of the metal relay electrode, and
the edge of the opening overlaps the metal relay electrode without crossing the edge of the metal relay electrode.

6. The display device of claim 5, wherein the second hole is formed by dry etching which uses plasma gas not containing oxygen.

7. The display device of claim 6, wherein the plasma gas is any one of sulfur hexafluoride ($SF_6$), nitrogen trifluoride ($NF_3$), and fluorine ($F_2$).

8. A display device comprising:
a semiconductor layer;
a relay electrode;
a common electrode;
a pixel electrode;
an interlayer insulating film located between the semiconductor layer and the relay electrode;
an organic insulating film located between the relay electrode and the common electrode; and
an inorganic insulating film located between the common electrode and the pixel electrode,
wherein:
the relay electrode is in contact with the semiconductor layer through a first contact hole formed in the interlayer insulating film,
the pixel electrode is in contact with the relay electrode through a first hole formed in the organic insulating film and a second hole formed in the inorganic insulating film,
an opening of the common electrode overlaps the first contact hole, the first hole and the second hole, in planar view,
an edge of the first contact hole is located inside the second hole without crossing an edge of the second hole,
the edge of the second hole is located inside the first hole without crossing an edge of the first hole,
the edge of the first hole is located inside the opening without crossing an edge of the opening,
the edge of the opening overlaps the relay electrode without crossing an edge of the relay electrode, in planar view, and
a center of the first contact hole, a center of the first hole, and a center of the second hole are located on a same straight line.

9. The display device of claim 8, wherein the center of the first contact hole, the center of the first hole, and the center of the second hole match one another.

10. The display device of claim 8, wherein the center of the first contact hole matches with the center of the first hole or the center of the second hole.

11. The display device of claim 8, wherein:
the center of the first contact hole is different from the center of the first hole and the center of the second hole; and
the center of the first hole matches with the center of the second hole.

12. The display device of claim 8, wherein:
the center of the first contact hole is different from the center of the first hole and the center of the second hole, and
the center of the first hole is different from the center of the second hole.

13. The display device of claim 12, wherein the center of the second hole is located between the center of the first contact hole and the center of the first hole, in planar view.

* * * * *